(12) United States Patent
Sakoh et al.

(10) Patent No.: US 7,078,258 B2
(45) Date of Patent: Jul. 18, 2006

(54) IMAGE SENSOR AND MANUFACTURING METHOD OF IMAGE SENSOR

(75) Inventors: Hirsoshi Sakoh, Kyotanabe (JP); Hiroshi Okamoto, Mishima-gun (JP); Ryoichi Nagayoshi, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 18 days.

(21) Appl. No.: 10/847,443

(22) Filed: May 18, 2004

(65) Prior Publication Data

US 2004/0241898 A1 Dec. 2, 2004

(30) Foreign Application Priority Data

May 30, 2003 (JP) .............................. 2003-155623

(51) Int. Cl.
*H01L 21/00* (2006.01)
(52) U.S. Cl. ............................ 438/48; 438/57; 438/69; 438/70; 438/72; 438/66
(58) Field of Classification Search ................. None
See application file for complete search history.

(56) References Cited

U.S. PATENT DOCUMENTS

| 4,783,691 | A  | * | 11/1988 | Harada ..................... 257/435 |
| 6,365,916 | B1 | * | 4/2002  | Zhong et al. ................. 257/59 |
| 6,700,134 | B1 | * | 3/2004  | Yamazaki et al. ............ 257/72 |
| 6,707,067 | B1 | * | 3/2004  | Zhong et al. ................. 257/59 |
| 2002/0142498 | A1 | * | 10/2002 | Kubota et al. ................ 438/16 |
| 2004/0156105 | A1 | * | 8/2004  | Trapani et al. ............... 359/499 |

FOREIGN PATENT DOCUMENTS

JP        9-293848        11/1997

* cited by examiner

*Primary Examiner*—Luan Thai
(74) *Attorney, Agent, or Firm*—Wenderoth, Lind & Ponack, L.L.P.

(57) ABSTRACT

In a manufacturing method of an image sensor, a lightproof film (an antireflective film for avoiding flares) is formed over a wiring area; a transparent film is formed over an imaging area using a material capable of patterning; a transparent film, for forming micro lense on top, is formed on the transparent film, wherein a height of the top surfaces of the transparent film and the lightproof film are evenly formed.

7 Claims, 5 Drawing Sheets

IMAGE SENSOR AND MANUFACTURING METHOD OF IMAGE SENSOR

BACKGROUND OF THE INVENTION (1) Field of the Invention

The present invention relates to a manufacturing method of an image sensor comprising an imaging area which includes a plurality of pixel units and a wiring area around the imaging area, and in particular, to the improvement of a shading characteristic.

(2) Description of the Related Art

Recently, the sensitivity of an image sensor has been improved by forming a micro lens on each pixel and collecting an incident light on each of a plurality of pixel units.

FIG. 1 is a top view of such an image sensor as described above. In FIG. 1, the image sensor comprises an imaging area 2 including a plurality of pixel units (a photodiode), a wiring area 3 around the imaging area 2, and an antireflective film 4. The antireflective film 4 is a lightproof filter of low transmittance (e.g. black), formed on the wiring area 3 surrounding the imaging area 2, and is equipped so as to prevent flares caused by a reflected incident light. Here, flares refer to light reaching a photodiode that causes a low-contrast image of a subject or a turbidity of colors, the light for contributing to imaging the subject, such as a reflected light and a scattered light occurring on the surface of the photodiode or in a path of an incident light.

Japanese Laid-Open Patent application No. H9-293848 discloses a technology in which the occurrence of a flare is decreased by forming a scattered reflective film on the antireflective film 4 and decreasing the reflectivity around the imaging area 2.

However, the problem with the conventional technology is that a step height is generated between the imaging area 2 and the area above the wiring area 3 including the antireflective film 4 for avoiding a flare, especially around the imaging area, thus causing an uneven sensitivity (shading), and thereby degrading image quality.

This problem will be explained in further detail using FIG. 2. FIG. 2 is a section view of the ambient imaging area of an image sensor of the conventional technology. As FIG. 2 shows, there is a wiring area 3 around the imaging area 2 including a plurality of pixel units (photodiode 5). The manufacturing processes are as follows: i) the wiring area 3 is flattened, ii) an anti-flare pattern of low transmittance (an antireflective film, a lightproof film) is formed on the wiring area 3, iii) a transparent film 8 such as acryl is applied as necessary, and iv) micro lenses are formed on the transparent film 8.

According to this structure, a step height is generated in the ambient part (8a in FIG. 2) which exists from the imaging area 2 to the wiring area 3. In other words, the distance between the photodiode 5 and the micro lenses is different at the central of the imaging area 2 than at the ending part of the imaging area 2. In the ending part of the imaging area 2, the distance between the micro lenses and the photodiode 5 deviates from the optimum design value, and therefore the photodiode does not acquire enough incident light. Consequently, an uneven sensitivity (shading) is created, thereby degrading image quality.

SUMMARY OF THE INVENTION

An object of the present invention, in view of the above problem, is to provide an image sensor of low shading and a manufacturing method of the image sensor, the image sensor having less uneven sensitivity and including an antireflective film for avoiding flares.

The manufacturing method of the image sensor according to the present invention in order to achieve the above object comprises: a manufacturing method of an image sensor including an imaging area having a plurality of pixel units, and a wiring area around the imaging area, the manufacturing method comprising: a first step of forming a lightproof film over the wiring area and forming a transparent film over the imaging area by patterning; a second step of forming a flat film, wherein in the first step, the height between the top surface of the transparent film and that of the lightproof film is evenly formed. Here, the material capable of patterning, for forming the transparent film, is, for example, a phenol type resin.

According to the image sensor manufactured by such processes as described above, it is possible to pattern each of the lightproof film over the wiring area and the transparent film over the imaging area. Thus, it is possible to make the height even between the top surface of the transparent film and that of the antireflective film. Consequently, it possible to manufacture the image sensor of low shading which has less uneven sensitivity than the conventional image sensor although it includes the antireflective film (lightproof film) for avoiding flares.

Here, in the first step, the lightproof film is firstly formed by patterning, then the transparent film is formed is formed by patterning, and the thickness of each film is decided so as to make the height of the top surface of the films even. Also, the reverse order is possible, wherein the transparent film is firstly formed by patterning, then the lightproof film is formed by patterning, and the thickness of each film is decided so as to make the height of the top surface of the films even.

In addition, in the first step, photoresists of different characteristics of sensitivity are used between a negative type and a positive type when the lightproof film and the transparent film are formed. According to this structure, the mask pattern for the light exposure required for the patterning including the processes of applying the photoresist, exposing it to light and developing it can be utilized for forming both the lightproof film and the transparent film. In other words, one mask pattern can be used for the patterning of both the lightproof film and the transparent film.

Furthermore, the manufacturing method of the image sensor according to the present invention comprises: a manufacturing method of an image sensor including an imaging area having a plurality of pixel units, and a wiring area around the imaging area, the manufacturing method comprising: a step of forming a flat film, on top of which micro lenses are formed, on the transparent film; and a step of forming a lightproof film over the wiring area; wherein the lightproof film is formed either on or under the flat film.

According to this structure, the lightproof film is formed either on or under the flat film. In both cases, the lightproof film does not exist sin the flat film, and thereby it is possible to maintain the thickness of the flat film on which the micro lenses are formed even between the central part and the ambient part of the imaging area. In the case that the lightproof film is formed on the flat film, the lightproof film is formed after the flat film. In the case that the lightproof film is formed under the flat film, the lightproof film is formed over the wiring area; the top surface of the lightproof film and that of the imaging area are made even; and the flat film on which the micro lenses are formed is formed over the lightproof film and the imaging area. Consequently, in both cases the lightproof film does not exist in the flat film, and thereby it is possible to maintain the thickness of the flat film on which the micro lenses are formed even between the central part and the ambient part of the imaging area. Thus, it is possible to manufacture the image sensor of low shading and the manufacturing method of the image sensor, the image sensor having less uneven sensitivity while including the antireflective film for avoiding flares.

Moreover, the image sensor of the present invention comprises an imaging area having a plurality of pixel units and a wiring area around the imaging area, the image sensor comprising: a lightproof film formed over the wiring area; a transparent film formed over the imaging area; and a flat film, on which micro lenses are formed, formed on the transparent film; wherein the top surface of the transparent film and that of the lightproof film are evenly formed.

Furthermore, the image sensor of the present invention comprises an imaging area including a plurality of pixel units and a wiring area around the imaging area, the image sensor comprising: a flat film, on which micro lenses are formed, the flat film being formed over the imaging area or over both the imaging area and the wiring area; and the lightproof film formed over the wiring area, wherein the lightproof film is formed either on or under the flat film.

According to this structure, the same effects can be acquired as described above.

According to the image sensor and its manufacturing method of the present invention, it is possible to manufacture the image sensor of low shading and the manufacturing method of the image sensor, the image sensor having less uneven sensitivity while including the antireflective film for avoiding flares. Also, one mask pattern can be used for the patterning of both the lightproof film and the transparent film.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

(First Embodiment)

Figure 1:
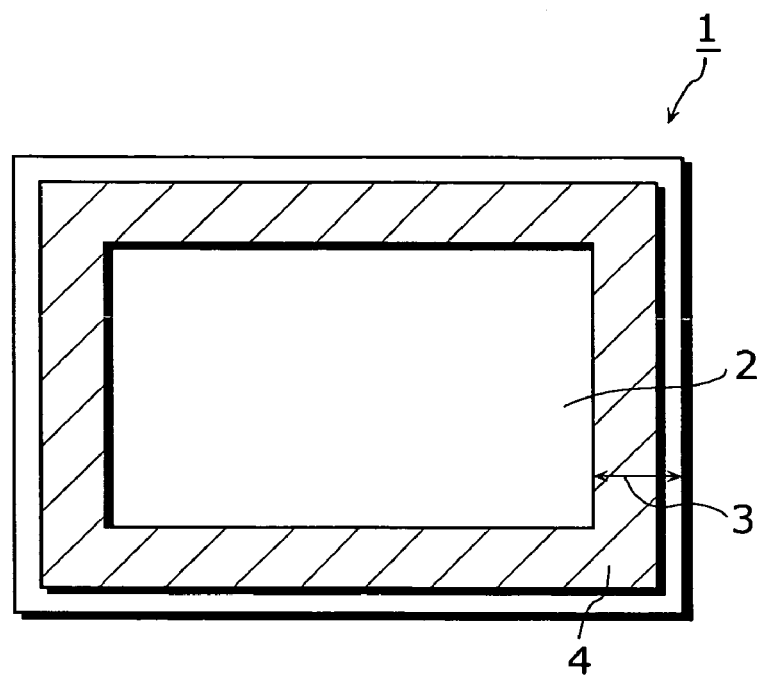
FIG. 1 is a top view of the image sensor.
Figure 2:
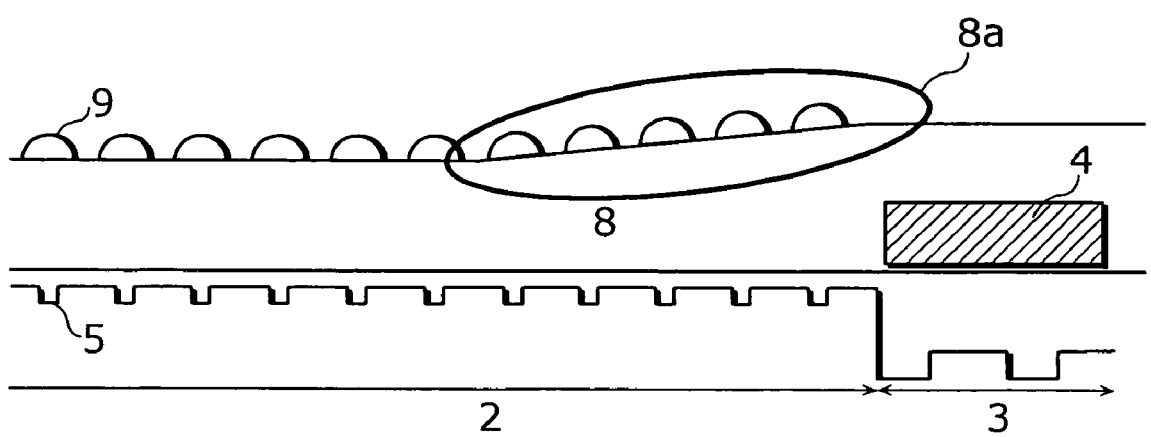
FIG. 2 is a section view of the image sensor comprising an anti-flare pattern of the conventional technology.

FIG. 1 is a top view of the image sensor according to the first embodiment, the image sensor comprising an imaging area 2 including a plurality of pixel units (photodiode 5), a wiring area 3, and a lightproof film 4 on the wiring area 3.

In the manufacturing method of the image sensor according to the first embodiment, a transparent film 10 is formed on the imaging area 2 using a material capable of patterning and of the same thickness as an anti-flare pattern, either before or after the anti-flare pattern of low transmittance (lightproof film 4) is formed on the wiring area 3. In the formation of the transparent film 10 and the lightproof film 4, the height is made even between the top surface of the transparent film 10 and the top surface of the lightproof film 4. The micro lenses 9 are formed after a transparent film 8 such as acryl is applied. Consequently, a step height caused by the anti-flare pattern (lightproof film 4) is eliminated, and thus an image sensor of low shading can be manufactured.

Figure 3A:
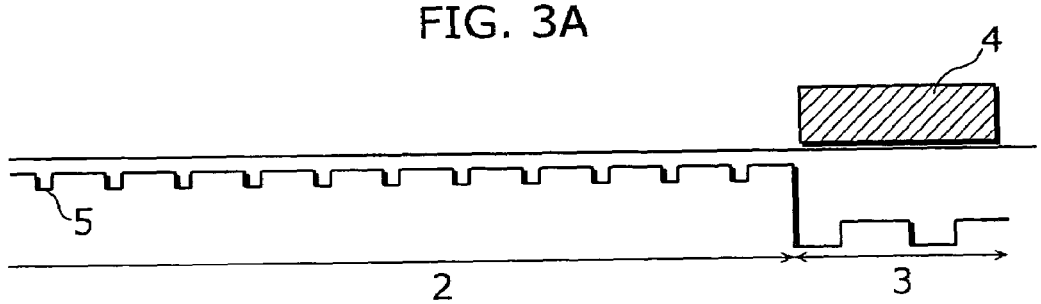
FIG. 3A–FIG. 3C show section views of the image sensor according to a first embodiment of the present invention in the order of the manufacturing processes.
Figure 3B:
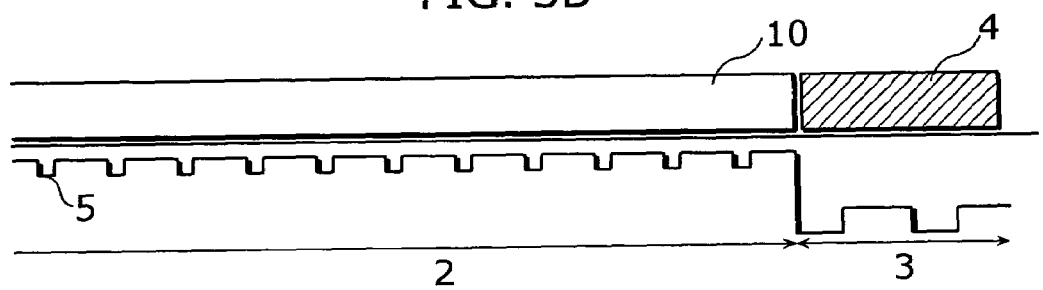
Figure 3C:
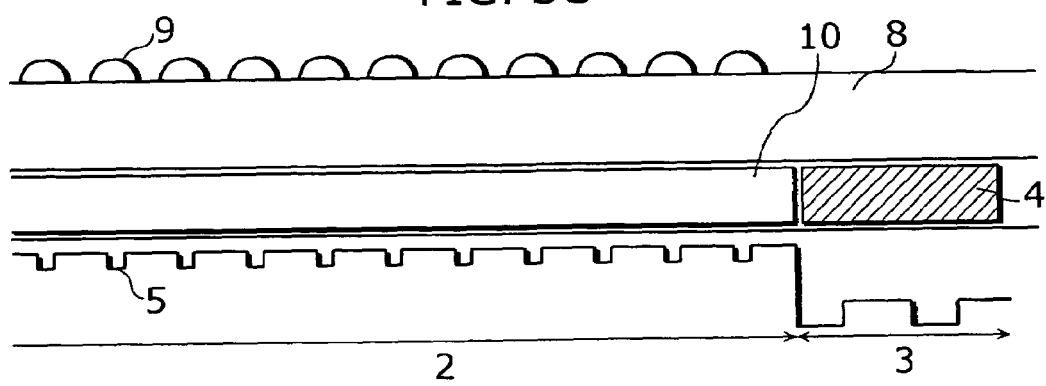

FIG. 3A–FIG. 3C show section views of the image sensor according to the first embodiment in the order of the manufacturing processes. The manufacturing processes according to the present embodiment will be explained in the order of (101)–(106) as follows:

(101) After the wiring area 3 and the imaging area 2 are formed, a transparent film is formed on the wiring area 3 and the imaging area 2 so as to make a flat film over the wiring area 3 and the imaging area 2. This formation of the transparent film is performed, for example, by applying a transparent film, exposing it to light, and developing it.

(102) As shown in FIG. 3A, a colorable photoresist 4 of the same thickness (0.3–0.9 µm) as the transparent film described above is formed on the wiring area 3. This formation is also performed by patterning, that is, by applying the colorable photoresist 4 of 0.3–0.9 µm, exposing it to light, and developing it.

(103) As shown in FIG. 3B, the colorable photoresist 4 is colored black, the photoresist 4 being formed on the wiring area 3, and thereby, the photoresist 4 is formed as the lightproof film 4 (antireflective film).

(104) As shown in FIG. 3B, the transparent film 10 is formed, using a material capable of patterning, on the imaging area 2 covered with the flattening transparent film. As a material capable of patterning, there is, for example, phenol type resin. Since acryl resin is not capable of patterning in general, it is not used here. The formation of this transparent film 10 is performed by applying the material capable of patterning, exposing it to light, and developing it. In other words, (i) the material capable of patterning is applied (0.3–0.9 μm) all over the top surface of the imaging area 2 covered with the flattening transparent film; ii) the transparent film 10 is exposed to light using a mask which covers only the imaging area 2, not the wiring area 3 in the case the material capable of patterning is a negative type; and iii) the area which was uncovered with the mask (the exposed area) is eliminated by developing the transparent film 10. In the case the material capable of patterning is a positive type, the transparent film 10 is exposed to light using a mask which covers only the wiring area 3, not the imaging area 2; thereby, the area which was covered with the mask (the unexposed area) is eliminated by developing the transparent film 10. In the processes of (102) and (104), in the case a photoresist of the opposite characteristic is used, it is possible to conduct the two processes with only one mask.

(105) As shown in FIG. 3C, the flat film (the transparent film 8) for forming micro lenses on top is applied (0.3–5.0 μm). The transparent film can be acryl.

(106) As shown in FIG. 3C, micro lenses 9 are formed.

According to the image sensor manufactured by such processes as described above, it is possible to pattern each of the lightproof film 4 over the wiring area 3 and the transparent film 10 over the imaging area 2. Thus, it is possible to make the height even between the top surface of the transparent film 10 and that of the antireflective film 4. Consequently, it possible to manufacture the image sensor of low shading which has less uneven sensitivity than the conventional image sensor although it includes the antireflective film (lightproof film 4) for avoiding flares.

(Variation 1)

The manufacturing processes according to a first variation of such manufacturing method as described above will be explained in the order of (201)–(205). however, the same processes will be omitted and the different processes will be mainly explained.

(201) The wiring area 3 is flattened in the same manner as (101).

(202) As shown in FIG. 3A, the black photoresist 4 (Black) for controlling reflections is formed on the wiring area 3 by applying the black photoresist 4 of 0.3–0.9 μm, exposing it to light, and developing it. Thus, the black photoresist 4 (Black) is formed as the antireflective film. The photoresist can be either of a negative type or a positive type.

(203) As shown in FIG. 3B, the transparent film 10 is formed in the area where Black does not exist by applying the transparent film 10 of 0.3–0.9 μm, exposing it to light, and developing it. The sensitivity characteristic of the transparent film 10 can be either of a negative type or a positive type. In the case the photoresist of Black is a positive type and the transparent film 10 is a negative type, it is possible to conduct two processes with one mask; and vice versa.

(204) As shown in FIG. 3C, on Black and the transparent film 10, the flat film (the transparent film 8) for forming micro lenses on top is applied (0.3–5.0 μm).

(205) The micro lenses are formed on the transparent film 8.

(Variation 2)

In addition, the manufacturing processes according to a second variation of such manufacturing method as described above will be explained in the order of (301)–(306). However, the same processes will be omitted and the different processes will be mainly explained.

(301) The wiring area 3 is flattened in the same manner as (101).

(302) The blue or red photoresist (Blue or Red) is formed on the wiring area 3 by applying the blue or red photoresist of 0.3–0.9 μm, exposing it to light, and developing it. The photoresist can be either of a negative type or a positive type. Thus, about the lower half of the antireflective film 4 of FIG. 3A is formed.

(303) On the blue of red photoresist, another red or blue photoresist (Red or Blue) is formed by applying the red or blue photoresist of 0.3–0.9 μm, exposing it to light, and developing it. The photoresist can be either of a negative type or a positive type. Thus, about the upper half of the antireflective film 4 of FIG. 3A is formed.

(304) On the imaging area 2, the transparent film 10 is formed by applying the transparent film of the same thickness as the combined blue and red photoresists, exposing it to light, and developing it. The sensitivity characteristic of the transparent film 10 can be either of a negative type or a positive type. In the case the photoresist of Red and Blue is a positive type and the transparent film 10 is a negative type, it is possible to conduct two processes with one mask; and vice versa.

(305) As shown in FIG. 3C, on Red and Blue and the transparent film 10, the flat film (the transparent film 8) for forming micro lenses on top is applied (0.3–5.0 μm).

(306) The micro lenses 9 are formed on the transparent film 8.

(Variation 3)

Finally, the manufacturing processes according to a third variation of such manufacturing method as described above will be explained in the order of (401)–(408). However, the same processes will be omitted and the different processes will be mainly explained.

(401) The wiring area 3 is flattened in the same manner as (101).

(402) The colorable photoresist is formed on the wiring area 3 by applying it (0.3–0.9 μm), exposing it to light, and developing it. The photoresist can be either of a negative type or a positive type. Thus, about the lower half of the antireflective film 4 as in FIG. 3A is formed.

(403) The colorable photoresist is colored blue (or red).

(404) On the blue (or red) photoresist, another colorable photoresist is formed by applying it (0.3–0.9 μm), exposing it to light, and developing it. The photoresist can be either of a negative type or a positive type.

(405) The colorable photoresist is colored red (or blue). Thus, about the upper half of the antireflective film 4 as in FIG. 3A is formed.

(406) On the imaging area 2, the transparent film 10 is formed by applying the transparent film of the same thickness (0.6–1.8 μm) as the combined blue and red photoresists (Blue and Red), exposing it to light, and developing it. The sensitivity characteristic of the transparent film 10 can be either of a negative type or a positive type. In the case the photoresist of Red and Blue is a positive type and the transparent film 10 is a negative type, it is possible to conduct two processes with one mask; and vice versa.

(407) As shown in FIG. 3C, on Red and Blue and the transparent film 10, the flat film (the transparent film 8) for forming micro lenses on top is applied (0.3–5.0 μm).

(408) The micro lenses 9 are formed on the transparent film 8.

(Second Embodiment)

Figure 4A:
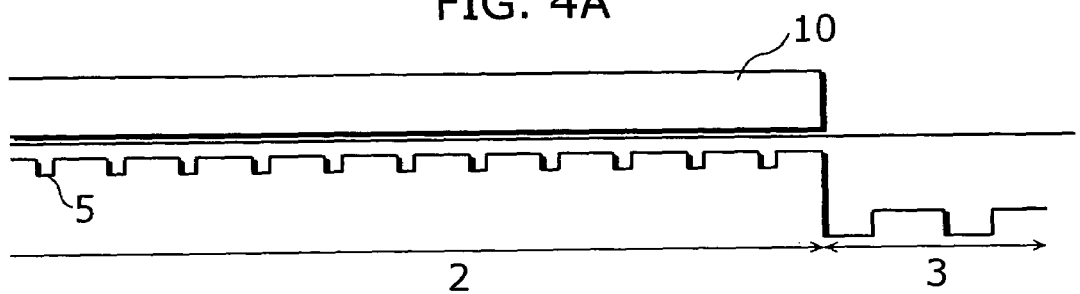
FIG. 4A–FIG. 4C show section views of the image sensor according to a second embodiment in the order of the manufacturing processes.
Figure 4B:
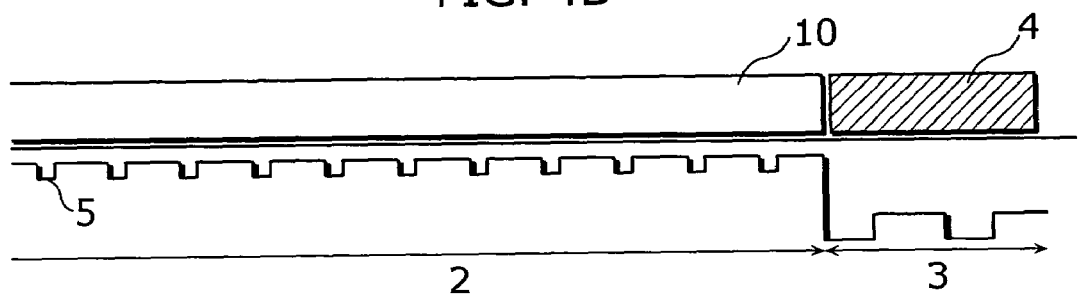
Figure 4C:
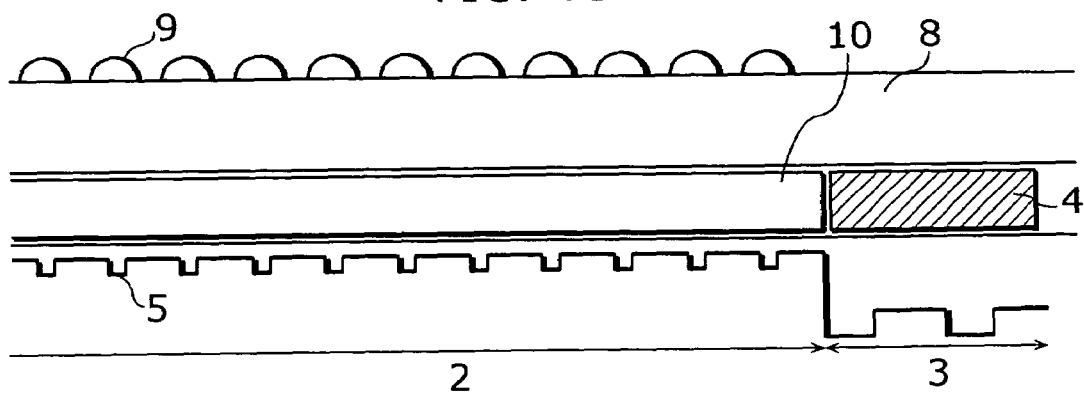

FIG. 4A–FIG. 4C show section views of the image sensor according to the second embodiment in the order of the manufacturing processes. While the transparent film 10 is formed after the formation of the lightproof film 4 according to the manufacturing method in FIG. 3, the lightproof film 4 is formed after the formation of the transparent film 10 in FIG. 4.

The manufacturing processes according to the second embodiment will be explained in the order of (101*a*)–(106*a*) as follows. However, the same processes as the first embodiment will be omitted, and the different processes will be mainly explained.

(101*a*) The wiring area 3 is flattened in the same manner as (101).

(102*a*) The transparent film 10 is formed on the imaging area 2 in the same manner as (104). FIG. 4A is a section view of this formation.

(103*a*) The colorable photoresist of the same thickness (0.3–0.9 μm) as the transparent film is formed on the wiring area in the same manner as (102).

(104*a*) The colorable photoresist is colored black in the same manner as (103). FIG. 4B is a section view of this formation. Thus, the lightproof film 4 (the antireflective film) is formed.

(105*a*) The flat film (the transparent film 8) for forming micro lenses on top is applied (0.3–5.0 μm) in the same manner as (105).

(106*a*) The micro lenses 9 are formed in the same manner as (106). FIG. 4C is a section view of this formation.

According to the image sensor manufactured by such processes as described above, it is possible to form each of the lightproof film 4 over the wiring area 3 and the transparent film 10 over the imaging area 2. Thus, it is possible to make the height even between the top surface of the transparent film 10 and that of the antireflective film 4. Consequently, it possible to manufacture the image sensor of low shading which has less uneven sensitivity than the conventional image sensor although it includes the antireflective film (lightproof film 4) for avoiding flares.

The fourth through sixth variations of the manufacturing method according to the present embodiment will be explained as follows. The fourth through sixth variations are performed according to the manufacturing method in which the order of the formations of the lightproof film 4 and the transparent film 10 is reversed from that of the first through third variations according to the first embodiment as mentioned above. In other words, in the fourth through sixth variations, the lightproof film 4 is formed after the transparent film 10 in the same manner as the first through third variations.

(Third Embodiment)

Figure 5A:
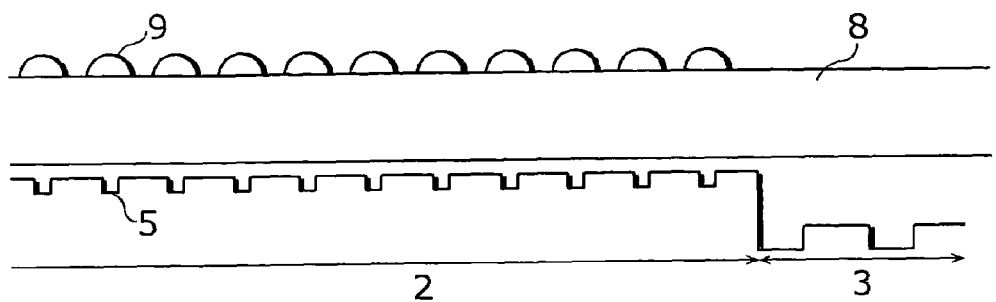
FIG. 5A and FIG. 5B show section views of the image sensor according to a third embodiment in the order of the manufacturing processes.
Figure 5B:
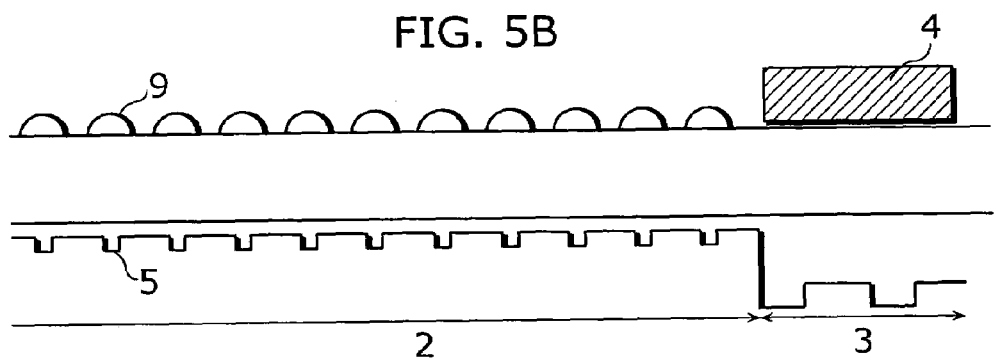

FIG. 5A–FIG. 5B show section views of the image sensor according to the third embodiment in the order of the manufacturing processes. The manufacturing processes according to the third embodiment will be explained in the order of (901)–(905) as follows.

(901) The wiring area 3 is flattened in the same manner as (101).

(902) The flat film (the transparent film 8) for forming micro lenses on top is applied (0.3–5.0 μm).

(903) The micro lenses 9 are formed. FIG. 5A is a section view of this formation.

(904) Over the wiring area 3, the colorable photoresist is formed by applying it (0.3–0.9 μm), exposing it to light, and developing it. The photoresist can be either of a negative type or a positive type.

(905) The colorable photoresist is colored black (Black). Thus, the lightproof film 4 is formed. FIG. 5B shows the section view of this formation.

In this manner, the lightproof film 4 is formed on the flat film (the transparent film 8) for forming micro lenses on top, thereby this formation prevents the step height from occurring among the micro lenses due to the lightproof film 4. In other words, the flat film including the micro lenses on top is evenly formed over the imaging area 2 and the wiring area 3. Consequently, it is possible to manufacture the image sensor of low shading which has less uneven sensitivity than the conventional image sensor.

The flat film (the transparent film 8) is formed over the imaging area 2 and the wiring area 3. However, as long as the transparent film 8 is formed over the imaging area 2, the same effects can be acquired.

The manufacturing processes according to a first variation of the third embodiment will be explained in the order of (111)–(114) as follows. However, the same processes will be omitted and the different processes will be mainly explained.

(111) The wiring area 3 is flattened in the same manner as (101).

(112) The flat film (the transparent film 8) for forming micro lenses on top is applied (0.3–5.0 μm; depending on the cell size).

(113) The micro lenses 9 are formed. FIG. 5A shows the section view of this formation.

(114) Over the wiring area 3, the black photoresist (Black) is patterned by applying it (0.3–0.9 μm), exposing it to light, and developing it. The photoresist can be either of a negative type or a positive type. Thus, the lightproof film 4 is formed. FIG. 5B shows the section view of this formation.

The manufacturing processes according to a second variation of the third embodiment will be explained in the order of (121)–(124) as following. However, the same processes will be omitted and the different processes will be mainly explained.

(121) The wiring area 3 is flattened in the same manner as (101).

(122) The flat film (the transparent film 8) for forming micro lenses on top is applied in the same manner as (112).

(123) The micro lenses 9 are formed in the same manner as (113). FIG. 5A shows the section view of this formation.

(124) On the wiring area 3, the red photoresist (Red) is formed by applying it (0.3–0.9 μm), exposing it to light, and developing it. The photoresist can be either of a negative type or a positive type.

(125) On Red, the blue photoresist (Blue) is formed by applying it (0.3–0.9 μm), exposing it to light, and developing it. The photoresist can be either of a negative type or positive type. FIG. 5B shows the section view of this formation.

The manufacturing processes according to a third variation of the third embodiment will be explained in the order of (131)–(134) as follows. However, the same processes will be omitted and the different processes will be mainly explained.

(131) The wiring area 3 is flattened in the same manner as (101).

(132) The flat film (the transparent film 8) for forming micro lenses on top is applied in the same manner as (112).

(133) The micro lenses 9 are formed on the transparent film 8 in the same manner as (113). FIG. 5A shows the section view of this formation.

(134) The colorable photoresist is formed on the wiring area 3 by applying it (0.3–0.9 μm), exposing it to light, and developing it. The photoresist can be either of a negative type or a positive type.

(135) The colorable photoresist is colored red (or blue).

(136) On the red (or blue) photoresist, another colorable photoresist is formed by applying it (0.3–0.9 μm), exposing it to light, and developing it. The photoresist can be either of a negative type or a positive type.

(137) The colorable photoresist is colored blue (or red).

The image sensor as shown in FIG. 5B can be manufactured according to such variations as described above.

The manufacturing method of the image sensor as shown in FIG. 5B according to the processes of FIG. 6A and FIG. 6B will be explained as follows. While the lightproof film 4 is formed after the formation of the micro lenses in the manufacturing processes of FIG. 5, the lightproof film 4 is formed before the formation of the micro lenses in the manufacturing processes of FIG. 6.

The manufacturing processes of FIG. 6 will be explained in the order of (901*a*)–(905*a*) as follows. However, the same processes will be omitted and the different processes will be mainly explained.

(901*a*) The wiring area 3 is flattened in the same manner as (901).

(902*a*) The flat film (the transparent film 8) for forming micro lenses on top is applied (0.3–5.0 μm) in the same manner as (902).

(903*a*) On the wiring area 3, the colorable photoresist is formed by applying it (0.3–0.9 μm), exposing it to light, and developing it in the same manner as (904). The photoresist can be either of a negative type or a positive type.

(904*a*) The colorable photoresist is colored block (Black) in the same manner as (905). Thus, the lightproof film 4 is formed. FIG. 6A shows the section view of this formation.

(905*a*) The micro lenses 9 are formed in the same manner as (903). FIG. 6B is a section view of this formation (the same as FIG. 5B).

Figure 6A:
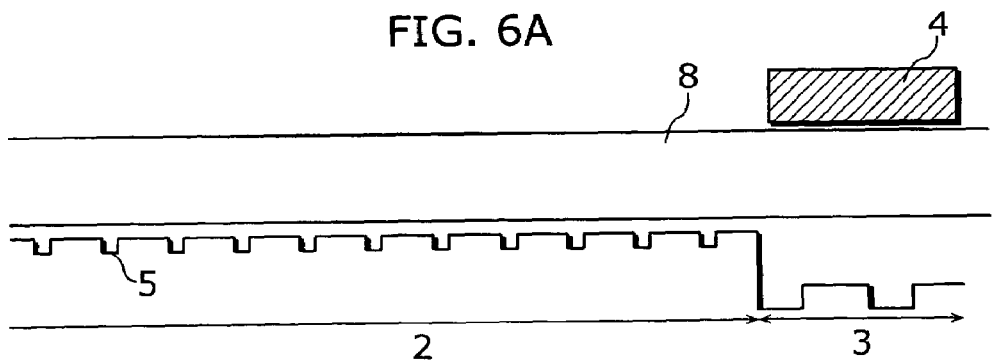
FIG. 6A and FIG. 6B show section views of the image sensor according to the third embodiment in another order of the manufacturing processes.
Figure 6B:
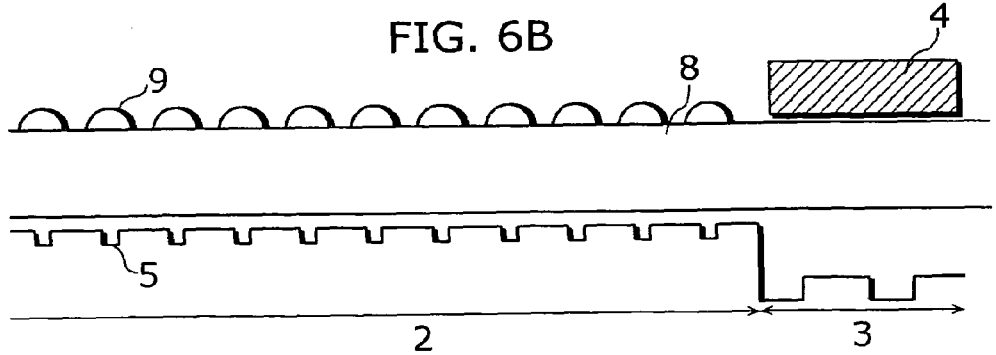

As described above, the order of the formations of the micro lenses and the lightproof film 4 is reversed between the manufacturing processes of FIG. 5A–FIG. 5B and those of FIG. 6A–FIG. 6B. However, it is possible to manufacture the image sensor comprising the flat film (the transparent film 8) which has an evenly flat top surface for forming micro lenses on top according to both of the manufacturing processes.

In the fourth through sixth variations, of the third embodiment, the order of the formations of the micro lenses and the lightproof film 4 is reversed from that of the first through third variations of the third embodiment.

(Fourth Embodiment)

Figure 7A:
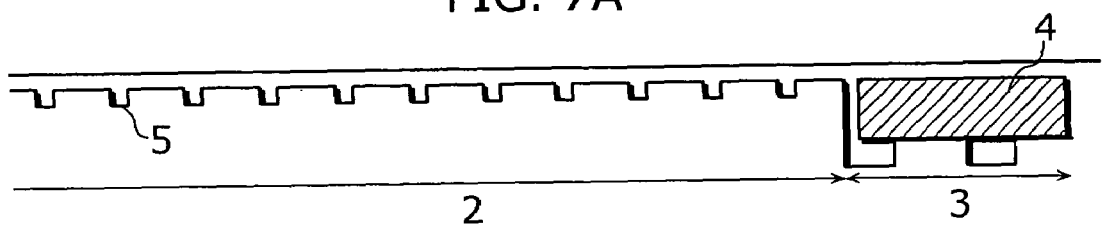
FIG. 7A and 7B show section views of the image sensor according to a fourth embodiment in the order of the manufacturing processes.
Figure 7B:
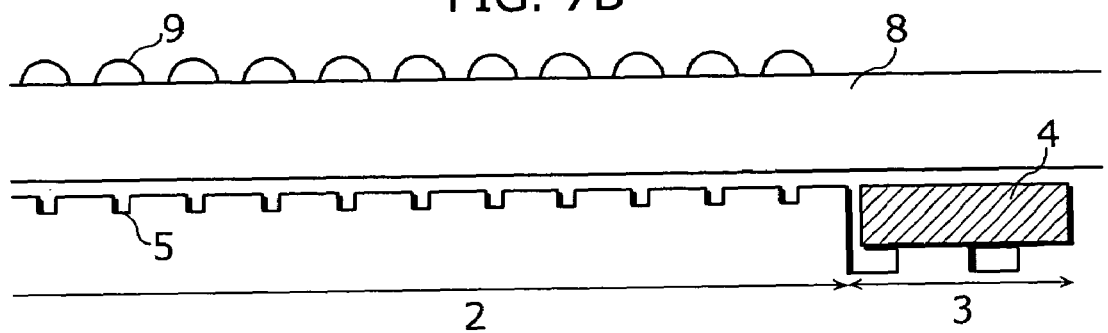

FIG. 7A–FIG. 7B show the section views of the image sensor according to the fourth embodiment in the order of the manufacturing processes. The manufacturing processes of the present embodiment will be explained in the order of (501)–(505).

(501) On the wiring area 3, the colorable photoresist is formed by applying it (0.3–0.9 μm), exposing it to light, and developing it so as to flatten the top surface of the wiring area 3. The photoresist can be either of a negative type or a positive type.

(502) The colorable photoresist is colored black (Black). Thus, the lightproof film 4 is formed. FIG. 7A shows the section view of this formation.

(503) On Black and the imaging area 2, the flat film (the transparent film 8) for forming micro lenses on top is formed (0.3–5.0 μm).

(504) The micro lenses are formed. FIG. 7B shows the section view of this formation.

As described above, according to the image sensor of the fourth embodiment, i) the lightproof film 4 is formed to fill the gap between the pixel units of the imaging area 2 and the wiring area 3; ii) the transparent film 8 is formed to flatten the top surface of the imaging area 2 and the wiring area 3 covered with the lightproof film 4; and iii) the micro lenses 9 are formed on the transparent film 8. In this manner, the flat film (the transparent film 8) for forming micro lenses on top is easily flattened. Consequently, it is possible to manufacture the image sensor of low shading which has less uneven sensitivity than the conventional image sensor.

The manufacturing processes according to a first variation of the fourth embodiment will be explained in the order of (601)–(603). However, the same processes will be omitted and the different processes will be mainly explained.

(601) On the wiring area 3, the black photoresist (Black) for controlling reflections is formed by applying it (0.3–0.9 μm), exposing it to light, and developing it. The photoresist can be either of a negative type or a positive type.

(602) On the imaging area 2 and the wiring area 3 covered with Black, the flat film (the transparent film 8) for forming micro lenses on top is formed (0.3–5.0 μm). FIG. 7A shows the section view of this formation.

(603) The micro lenses 9 are formed on the transparent film 8. FIG. 7B shows the section view of this formation.

The manufacturing processes according to a second variation of the fourth embodiment will be explained i the order of (701)–(704). However, the same processes will be omitted and the different processes will be mainly explained.

(701) On the wiring area 3, the red (or blue) photoresist is formed by applying it (0.3–0.9 μm), exposing it to light, and developing it. The photoresist can be either of a negative type or a positive type.

(702) On the red (or blue) photoresist, another blue (or red) photoresist is formed by applying it (0.3–0.9 μm), exposing it to light, and developing it. The photoresist can be either of a negative type or a positive type.

(703) On the imaging area 2 and the wiring area 3 covered with the red and blue photoresists, the flat film (the transparent film 8) for forming micro lenses on top is formed (0.3–5.0 μm). FIG. 7A shows the section view of this formation.

(704) The micro lenses 9 are formed. FIG. 7B shows the section view of this formation.

The manufacturing processes according to a third variation of the fourth embodiment will be explained in the order of (801)–(806). However, the same processes will be omitted and the different processes will be mainly explained.

(801) On the wiring area 3, the colorable photoresist is formed by applying it (0.3–0.9 μm), exposing it to light, and developing it. The photoresist can be either of a negative type or a positive type.

(802) The colorable photoresist is colored red (or blue).

(803) On the red (or blue) photoresist, another colorable photoresist is formed by applying it (0.3–0.9 μm), exposing it to light, and developing it. The photoresist can be either of a negative type or a positive type.

(804) The colorable photoresist is colored blue (or red).

(805) On the imaging area 2 and the wiring area 3 covered with the red and blue photoresists, the flat film (the transparent film 8) for forming micro lenses on top is formed (0.3–5.0 μm). FIG. 7A shows the section view of this formation.

(806) The micro lenses 9 are formed. FIG. 7B shows the section view of this formation.

The image sensor as shown in FIG. 7B can be manufactured according to such variations as described above.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

The invention claimed is:

1. A manufacturing method of an image sensor the image sensor including an imaging area having a plurality of pixel units and a wiring area around the imaging area, the manufacturing method comprising:

a first step of forming a lightproof film over the wiring area and forming a transparent film over the imaging area by patterning; and a second step of forming a flat film, an top of which micro lenses are formed, on the transparent film;

wherein in the first step, the lightproof film and the transparent film are formed such that a height between of a top surface of the transparent film and a height of a top surface of the lightproof film are substantially the same.

2. The manufacturing method according to claim 1, wherein in the first step, the lightproof film is formed prior to forming the transparent film, and a thickness of each the lightproof film and a thickness of the transparent, film are determined such that the top surface of the lightproof film and the top surface of the transparent film are even with one another.

3. The manufacturing method according to claim 1, wherein in the first step, the transparent film is formed by prior to forming the lightproof film, and a thickness of the lightproof film and a thickness of the transparent film are determined such that the top surface of the lightproof film and the top surface of the transparent film are even with one another.

4. The manufacturing method according to claim 1, wherein in the first step, photoresists of different characteristics of sensitivity are used between a negative type and a positive type when the lightproof film and the transparent film are formed.

5. The manufacturing method according to claim 4, wherein in the first step, the lightproof film is formed by prior to forming the transparent film, and a thickness of the lightproof film and a thickness of the transparent, film are determined such that the top surface of the lightproof film and the top surface of the transparent film are even with one another.

6. The manufacturing method according to claim 4, wherein in the first step, the transparent film is formed prior to forming the lightproof film, and a thickness of each the lightproof film and a thickness of the transparent, film are determined such that the top surface of the lightproof film and the top surface of the transparent film are even with one another.

7. A manufacturing method of an image sensor, the image sensor including an imaging area having a plurality units and a wiring area around the imaging area, the manufacturing method comprising:

forming a flat film, on top of which micro lenses are formed, over the imaging area or over both the imaging area and the wiring area; and forming a lightproof film over the wiring area, wherein the lightproof film is formed under the flat film.

* * * * *

UNITED STATES PATENT AND TRADEMARK OFFICE
CERTIFICATE OF CORRECTION

PATENT NO. : 7,078,258 B2  Page 1 of 1
APPLICATION NO. : 10/847443
DATED : July 18, 2006
INVENTOR(S) : Hiroshi Sakoh et al.

It is certified that error appears in the above-identified patent and that said Letters Patent is hereby corrected as shown below:

ON THE TITLE PAGE

In item [75], Inventors, "Hirsoshi Sakoh, Kyotanabe (JP)" should read --Hiroshi Sakoh, Kyotanabe (JP)--.

Signed and Sealed this

Third Day of October, 2006

JON W. DUDAS
*Director of the United States Patent and Trademark Office*